(12) United States Patent
Chen

(10) Patent No.: US 7,692,477 B1
(45) Date of Patent: *Apr. 6, 2010

(54) PRECISE CONTROL COMPONENT FOR A SUBSTRATE POTENTIAL REGULATION CIRCUIT

(76) Inventor: Tien-Min Chen, 1049 Jacqueline Way, San Jose, CA (US) 95129

( * ) Notice: Subject to any disclaimer, the term of this patent is extended or adjusted under 35 U.S.C. 154(b) by 0 days.

This patent is subject to a terminal disclaimer.

(21) Appl. No.: 10/746,539

(22) Filed: Dec. 23, 2003

(51) Int. Cl.
H03K 3/01 (2006.01)

(52) U.S. Cl. .................. 327/534; 327/540; 327/536

(58) Field of Classification Search .......... 327/538, 327/540, 541, 543, 534, 536; 323/315, 316
See application file for complete search history.

(56) References Cited

U.S. PATENT DOCUMENTS

| | | | |
|---|---|---|---|
| 4,246,517 A | 1/1981 | Dakroub | |
| 4,769,784 A * | 9/1988 | Doluca et al. | 365/149 |
| 4,798,974 A | 1/1989 | Reczek et al. | |
| 4,912,347 A * | 3/1990 | Morris | 326/66 |
| 4,929,621 A | 5/1990 | Manoury et al. | |
| 5,039,877 A | 8/1991 | Chern | |
| 5,086,501 A | 2/1992 | DeLuca et al. | |
| 5,113,088 A | 5/1992 | Yamamoto et al. | |
| 5,124,632 A * | 6/1992 | Greaves | 323/316 |
| 5,167,024 A | 11/1992 | Smith et al. | |
| 5,201,059 A | 4/1993 | Nguyen | |
| 5,204,863 A | 4/1993 | Saint-Joigny et al. | |
| 5,218,704 A | 6/1993 | Watts, Jr. et al. | |
| 5,230,055 A | 7/1993 | Katz et al. | |
| 5,239,652 A | 8/1993 | Seibert et al. | |
| 5,254,883 A * | 10/1993 | Horowitz et al. | 327/541 |
| 5,336,986 A * | 8/1994 | Allman | 323/268 |
| 5,386,135 A | 1/1995 | Nakazato et al. | |
| 5,394,026 A | 2/1995 | Yu et al. | |
| 5,406,212 A | 4/1995 | Hashinaga et al. | |
| 5,422,591 A | 6/1995 | Rastegar et al. | |
| 5,422,806 A | 6/1995 | Chen et al. | |
| 5,440,520 A | 8/1995 | Schutz et al. | |
| 5,447,876 A | 9/1995 | Moyer et al. | |
| 5,461,266 A | 10/1995 | Koreeda et al. | |
| 5,483,434 A | 1/1996 | Seesink | |
| 5,495,184 A * | 2/1996 | Des Rosiers et al. | 326/73 |
| 5,502,838 A | 3/1996 | Kikinis | |

(Continued)

FOREIGN PATENT DOCUMENTS

EP 0381021 8/1990

(Continued)

OTHER PUBLICATIONS

CMOS Circuit Design, Layout and Simulation; R. Jacob Baker, Harry W. Li, David E. Boyce; IEEE Press; 1998.

(Continued)

*Primary Examiner*—Quan Tra (57) ABSTRACT

A control circuit for substrate potential regulation for an integrated circuit device. The control circuit includes a current source configured to generate a reference current. A variable resistor is coupled to the current source. The variable resistor is configured to receive the reference current and generate a reference voltage at a node between the current source and the variable resistor. The reference voltage controls the operation of a substrate potential regulation circuit coupled to the node.

19 Claims, 6 Drawing Sheets

U.S. PATENT DOCUMENTS

| | | | |
|---|---|---|---|
| 5,506,541 A * | 4/1996 | Herndon | 327/541 |
| 5,511,203 A | 4/1996 | Wisor et al. | |
| 5,519,309 A | 5/1996 | Smith | |
| 5,560,020 A | 9/1996 | Nakatani et al. | |
| 5,592,173 A | 1/1997 | Lau et al. | |
| 5,682,093 A | 10/1997 | Kivela | |
| 5,692,204 A | 11/1997 | Rawson et al. | |
| 5,717,319 A | 2/1998 | Jokinen | |
| 5,719,800 A | 2/1998 | Mittal et al. | |
| 5,727,208 A | 3/1998 | Brown | |
| 5,744,996 A | 4/1998 | Kotzle et al. | |
| 5,745,375 A | 4/1998 | Reinhardt et al. | |
| 5,752,011 A | 5/1998 | Thomas et al. | |
| 5,754,869 A | 5/1998 | Holzhammer et al. | |
| 5,757,171 A | 5/1998 | Babcock | |
| 5,778,237 A | 7/1998 | Yamamoto et al. | |
| 5,781,060 A | 7/1998 | Sugawara | |
| 5,812,860 A | 9/1998 | Horden et al. | |
| 5,815,724 A | 9/1998 | Mates | |
| 5,818,290 A | 10/1998 | Tsukada | |
| 5,825,674 A | 10/1998 | Jackson | |
| 5,838,189 A * | 11/1998 | Jeon | 327/537 |
| 5,842,860 A | 12/1998 | Funt | |
| 5,848,281 A | 12/1998 | Smalley et al. | |
| 5,884,049 A | 3/1999 | Atkinson | |
| 5,894,577 A | 4/1999 | MacDonald et al. | |
| 5,900,773 A * | 5/1999 | Susak | 327/539 |
| 5,920,226 A * | 7/1999 | Mimura | 327/537 |
| 5,923,545 A | 7/1999 | Nguyen | |
| 5,929,621 A * | 7/1999 | Angelici et al. | 323/316 |
| 5,933,649 A | 8/1999 | Lim et al. | |
| 5,940,020 A * | 8/1999 | Ho | 341/145 |
| 5,940,785 A | 8/1999 | Georgiou et al. | |
| 5,940,786 A | 8/1999 | Steeby | |
| 5,952,871 A | 9/1999 | Jeon | |
| 5,974,557 A | 10/1999 | Thomas et al. | |
| 5,986,947 A | 11/1999 | Choi et al. | |
| 5,996,083 A | 11/1999 | Gupta et al. | |
| 5,996,084 A | 11/1999 | Watts | |
| 5,999,040 A | 12/1999 | Do et al. | |
| 6,006,169 A | 12/1999 | Sandhu et al. | |
| 6,018,264 A | 1/2000 | Jin | |
| 6,021,500 A | 2/2000 | Wang et al. | |
| 6,035,407 A | 3/2000 | Gebara et al. | |
| 6,047,248 A | 4/2000 | Georgiou et al. | |
| 6,048,746 A | 4/2000 | Burr | |
| 6,078,084 A | 6/2000 | Nakamura et al. | |
| 6,078,319 A | 6/2000 | Bril et al. | |
| 6,087,820 A * | 7/2000 | Houghton et al. | 323/315 |
| 6,087,892 A | 7/2000 | Burr | |
| 6,091,283 A | 7/2000 | Murgula et al. | |
| 6,100,751 A | 8/2000 | De et al. | |
| 6,118,306 A | 9/2000 | Orton et al. | |
| 6,119,241 A | 9/2000 | Michail et al. | |
| 6,141,762 A | 10/2000 | Nicol et al. | |
| 6,157,092 A | 12/2000 | Hofmann | |
| 6,202,104 B1 | 3/2001 | Ober | |
| 6,215,235 B1 | 4/2001 | Osamura | |
| 6,216,235 B1 | 4/2001 | Thomas et al. | |
| 6,218,708 B1 | 4/2001 | Burr | |
| 6,226,335 B1 | 5/2001 | Prozorov | |
| 6,229,379 B1 | 5/2001 | Okamoto | |
| 6,232,830 B1 | 5/2001 | Fournel | |
| 6,272,642 B2 | 8/2001 | Pole, II et al. | |
| 6,279,048 B1 | 8/2001 | Fadavi-Ardekani et al. | |
| 6,281,716 B1 * | 8/2001 | Mihara | 327/80 |
| 6,303,444 B1 | 10/2001 | Burr | |
| 6,304,824 B1 | 10/2001 | Bausch et al. | |
| 6,305,407 B1 | 10/2001 | Selby | |
| 6,311,287 B1 | 10/2001 | Dischler et al. | |
| 6,314,522 B1 | 11/2001 | Chu et al. | |
| 6,320,453 B1 | 11/2001 | Manning | |
| 6,337,593 B1 | 1/2002 | Mizuno et al. | |
| 6,345,362 B1 | 2/2002 | Bertin et al. | |
| 6,345,363 B1 | 2/2002 | Levy-Kendler | |
| 6,347,379 B1 | 2/2002 | Dai et al. | |
| 6,370,046 B1 | 4/2002 | Nebrigic et al. | |
| 6,373,323 B2 | 4/2002 | Kuroda | |
| 6,373,325 B1 | 4/2002 | Kuriyama | |
| 6,378,081 B1 | 4/2002 | Hammond | |
| 6,388,432 B2 | 5/2002 | Uchida | |
| 6,415,388 B1 | 7/2002 | Browning et al. | |
| 6,424,203 B1 | 7/2002 | Bayadroun | |
| 6,424,217 B1 * | 7/2002 | Kwong | 330/253 |
| 6,425,086 B1 | 7/2002 | Clark et al. | |
| 6,427,211 B2 | 7/2002 | Watts, Jr. | |
| 6,442,746 B1 | 8/2002 | James et al. | |
| 6,457,135 B1 | 9/2002 | Cooper | |
| 6,466,077 B1 | 10/2002 | Miyazaki et al. | |
| 6,469,573 B2 | 10/2002 | Kanda et al. | |
| 6,476,632 B1 | 11/2002 | La Rosa et al. | |
| 6,477,654 B1 | 11/2002 | Dean et al. | |
| 6,486,729 B2 | 11/2002 | Imamiya | |
| 6,487,668 B2 | 11/2002 | Thomas et al. | |
| 6,489,224 B1 | 12/2002 | Burr | |
| 6,496,027 B1 * | 12/2002 | Sher et al. | 324/763 |
| 6,496,057 B2 * | 12/2002 | Wada et al. | 327/543 |
| 6,510,400 B1 | 1/2003 | Moriyama | |
| 6,510,525 B1 | 1/2003 | Nookala et al. | |
| 6,513,124 B1 | 1/2003 | Furuichi et al. | |
| 6,518,828 B2 * | 2/2003 | Seo et al. | 327/534 |
| 6,519,706 B1 | 2/2003 | Ogoro | |
| 6,529,421 B1 * | 3/2003 | Marr et al. | 365/189.09 |
| 6,531,912 B2 | 3/2003 | Katou | |
| 6,563,371 B2 * | 5/2003 | Buckley et al. | 327/539 |
| 6,570,371 B1 * | 5/2003 | Volk | 323/315 |
| 6,574,577 B2 | 6/2003 | Stapleton et al. | |
| 6,574,739 B1 | 6/2003 | Kung et al. | |
| 6,600,346 B1 | 7/2003 | Macaluso | |
| 6,617,656 B2 | 9/2003 | Lee et al. | |
| 6,642,774 B1 | 11/2003 | Li | |
| 6,675,360 B1 | 1/2004 | Cantone et al. | |
| 6,677,643 B2 | 1/2004 | Iwamoto et al. | |
| 6,700,434 B2 | 3/2004 | Fujii et al. | |
| 6,731,221 B1 | 5/2004 | Dioshongh et al. | |
| 6,737,909 B2 * | 5/2004 | Jaussi et al. | 327/541 |
| 6,741,118 B2 | 5/2004 | Uchikoba et al. | |
| 6,774,705 B2 | 8/2004 | Miyazaki et al. | |
| 6,784,722 B2 | 8/2004 | Tang et al. | |
| 6,791,146 B2 | 9/2004 | Lai et al. | |
| 6,791,212 B2 | 9/2004 | Pulvirenti et al. | |
| 6,792,379 B2 | 9/2004 | Ando | |
| 6,803,633 B2 | 10/2004 | Mergens et al. | |
| 6,809,968 B2 | 10/2004 | Marr et al. | |
| 6,865,116 B2 | 3/2005 | Kim et al. | |
| 6,882,172 B1 | 4/2005 | Suzuki et al. | |
| 6,889,331 B2 | 5/2005 | Soerensen et al. | |
| 6,906,582 B2 * | 6/2005 | Kase et al. | 327/541 |
| 6,917,240 B2 * | 7/2005 | Trafton et al. | 327/540 |
| 6,922,783 B2 | 7/2005 | Knee et al. | |
| 6,927,620 B2 | 8/2005 | Senda | |
| 6,936,898 B2 | 8/2005 | Pelham et al. | |
| 6,967,522 B2 | 11/2005 | Chandrakasan et al. | |
| 6,986,068 B2 | 1/2006 | Togawa | |
| 6,992,508 B2 | 1/2006 | Chow | |
| 7,012,461 B1 | 3/2006 | Chen et al. | |
| 7,030,681 B2 * | 4/2006 | Yamazaki et al. | 327/534 |
| 7,100,061 B2 | 8/2006 | Halepete et al. | |
| 7,119,604 B2 | 10/2006 | Chih | |
| 7,120,804 B2 | 10/2006 | Tschanz et al. | |
| 7,228,242 B2 | 6/2007 | Read et al. | |
| 7,362,165 B1 | 4/2008 | Chen | |
| 7,562,233 B1 | 7/2009 | Sheng et al. | |
| 2001/0028577 A1 | 10/2001 | Sung et al. | |

| | | | |
|---|---|---|---|
| 2002/0011650 | A1 | 1/2002 | Nishizawa et al. |
| 2002/0026597 | A1 | 2/2002 | Dai et al. |
| 2002/0067638 | A1 | 6/2002 | Kobayashi et al. |
| 2002/0073348 | A1 | 6/2002 | Tani |
| 2002/0083356 | A1 | 6/2002 | Dai |
| 2002/0087219 | A1 | 7/2002 | Dai |
| 2002/0087896 | A1 | 7/2002 | Cline et al. |
| 2002/0116650 | A1 | 8/2002 | Halepete et al. |
| 2002/0130701 | A1* | 9/2002 | Kleveland ............... 327/536 |
| 2002/0138778 | A1 | 9/2002 | Cole et al. |
| 2002/0140494 | A1 | 10/2002 | Thomas et al. |
| 2002/0194509 | A1 | 12/2002 | Plante et al. |
| 2003/0006590 | A1 | 1/2003 | Aoki et al. |
| 2003/0036876 | A1 | 2/2003 | Fuller, III et al. |
| 2003/0065960 | A1 | 4/2003 | Rusu et al. |
| 2003/0071657 | A1 | 4/2003 | Soerensen et al. |
| 2003/0074591 | A1 | 4/2003 | McClendon et al. |
| 2003/0098736 | A1 | 5/2003 | Uchikoba et al. |
| 2003/0189465 | A1 | 10/2003 | Abadeer et al. |
| 2004/0025061 | A1 | 2/2004 | Lawrence |
| 2004/0073821 | A1 | 4/2004 | Naveh et al. |
| 2004/0103330 | A1 | 5/2004 | Bonnett |
| 2004/0108881 | A1* | 6/2004 | Bokui et al. ............... 327/334 |
| 2004/0246044 | A1 | 12/2004 | Myono et al. |
| 2005/0225376 | A1 | 10/2005 | Kin Law |
| 2007/0283176 | A1 | 12/2007 | Tobias et al. |

FOREIGN PATENT DOCUMENTS

| | | |
|---|---|---|
| EP | 0474963 | 3/1992 |
| EP | 0501655 | 9/1992 |
| EP | 0504655 | 9/1992 |
| EP | 0624909 | 11/1994 |
| EP | 0978781 | 2/2000 |
| EP | 1398639 | 3/2004 |
| JP | S63223480 | 9/1988 |
| JP | H04114365 | 4/1992 |
| JP | 409185589 | 7/1997 |
| JP | 11-118845 | 4/1999 |
| JP | 2000172383 | 6/2000 |
| JP | 2001345693 | 12/2001 |
| JP | 2003324735 | 11/2003 |
| WO | 0127728 | 4/2001 |
| WO | 0238828 | 5/2002 |

OTHER PUBLICATIONS

Merriam-webster's Collegiate Dictionary, tenth edition, pp. 252 and 603 (Merriam-Webster Inc., Springfield, Mass, USA).
Notice of Allowance Mailed Nov. 23, 2007; Pat. No. 7362165.
Notice of Allowance Mailed Jan. 5, 2005; Pat. No. 7228242.
Notice of Allowance Mailed Aug. 10, 2006; Pat. No. 7228242.
Notice of Allowance Mailed Jun. 21, 2006; Pat. No. 7129771.
Notice of Allowance Mailed Mar. 13, 2009; U.S. Appl. No. 10/747,016.
Notice of Allowance Mailed Sep. 28, 2005; Pat. No. 7012461.
Notice of Allowance Mailed Nov. 20, 2007; Pat. No. 7562233.
Notice of Allowance Mailed Jul. 13, 2009; U.S. Appl. No. 10/874,407.
Notice of Allowance Mailed Oct. 1, 2008; U.S. Appl. No. 10/874,407.
Notice of Allowance Mailed Apr. 2, 2008; Pat. No. 7562233.
Final Office Action Mailed Oct. 30, 2006; U.S. Appl. No. 10/334,918.
Final Office Action Mailed Nov. 26, 2008; U.S. Appl. No. 10/334,918.
Final Office Action Mailed Jan. 31, 2007; U.S. Appl. No. 10/334,918.
Final Office Action Mailed Feb. 15, 2006; U.S. Appl. No. 10/334,918.
Non-Final Office Action Mailed May 15, 2006; U.S. Appl. No. 10/334,918.
Non-Final Office Action Mailed Jun. 13, 2005; U.S. Appl. No. 10/334,918.
Final Office Action Mailed Aug. 4, 2009; U.S. Appl. No. 10/334,918.
Non-Final Office Action Mailed May 13, 2008; U.S. Appl. No. 10/334,918.
Non-Final Office Action Mailed Nov. 23, 2007; U.S. Appl. No. 10/334,919.
Final Office Action Mailed Jan. 6, 2009; U.S. Appl. No. 10/334,919.
Final Office Action Mailed Feb. 21, 2007; U.S. Appl. No. 10/334,919.
Final Office Action Mailed Mar. 9, 2006; U.S. Appl. No. 10/334,919.
Non-Final Office Action Mailed May 28, 2009; U.S. Appl. No. 10/334,919.
Non-Final Office Action Mailed May 15, 2007; U.S. Appl. No. 10/334,919.
Non-Final Office Action Mailed Jun. 13, 2005; U.S. Appl. No. 10/334,919.
Non-Final Office Action Mailed Jul. 21, 2008; U.S. Appl. No: 10/334,919.
Non-Final Office Action Mailed Aug. 7, 2006; U.S. Appl. No: 10/334,919.
Non-Final Office Action Mailed Jun. 24, 2004; Pat. No. 7228242.
"Computer Software", Wikipedia, http://en.wikipedia.org/wiki/software, retrieved May 2, 2007.
"High Speed Digitally Adjusted Step-Down Controllers for Notebook CPUS"; Max1710/Max1711; MAXIM Manual; p. 11 and p. 21.
"Operation U (Refer to Functional Diagram)"; LTC 1736;, Linear Technology Manual; p. 9.
"Shmoo plotting: the black art of IC testing", (Baker et al.), IEEE design & test of computers, pp. 90-97, Jul. 1997 [XP783305].
"Wafer Burn-In Isolation Circuit", IBM Technical Disclosure Bulletin, IBM Corp., New York, US, vol. 32, No. 6B, Nov. 1, 1989, pp. 442-443, XP00073858 ISSN:0018-8689 the whole document.
Advisory Action Mailed May 7, 2007; U.S. Appl. No. 10/334,918.
Desai et al., "Sizing of Clock Distribution Networks for High Performance CPU Chips", Digital Equipment Corporation, Hudson, MA, pp. 389-394, 1996.
Hsu, Jui-Ching, "Fabrication of Single Walled Carbon Nanotube (SW-CNT) Cantilevers for Chemical Sensing", M. Sc Thesis, Louisiana State University, Dec. 2007.
International Preliminary Examination Report 157WO, Oct. 1, 2005.
International Preliminary Examining Authority, Written Opinion 157WO, Aug. 10, 2004.
International Search Report 157WO, May 10, 2004.
Non-Final Office Action Mailed Aug. 21, 2007; U.S. Appl. No. 10/951,835.
Final Office Action Mailed Dec. 2, 2005; Pat. No. 7129771.
Non-Final Office Action Mailed Dec. 23, 2004; Pat. No. 7129771.
Final Office Action Mailed Apr. 13, 2005; Pat. No. 7129771.
Non-Final Office Action Mailed Apr. 18, 2006; Pat. No. 7129771.
Non-Final Office Action Mailed Jul. 29, 2005; Pat. No. 7129771.
Non-Final Office Action Mailed Aug. 1, 2007; Pat. No. 7362165.
Final Office Action Mailed Mar. 9, 2009; U.S. Appl. No. 12/107,733.
Non-Final Office Action Mailed May 21, 2009; U.S. Appl. No. 12/107,733.
Non-Final Office Action Mailed Sep. 26, 2008; U.S. Appl. No. 12/107,733.
Final Office Action Mailed Oct. 30, 2007; U.S. Appl. No. 10/747,016.
Non-Final Office Action Mailed Nov. 18, 2005; U.S. Appl. No. 10/747,016.
Final Office Action Mailed Dec. 7, 2006; U.S. Appl. No. 10/747,016.
Non-Final Office Action Mailed Dec. 22, 2004; U.S. Appl. No. 10/747,016.
Non-Final Office Action Mailed Mar. 20, 2008; U.S. Appl. No. 10/747,016.
Final Office Action Mailed Apr. 22, 2005; U.S. Appl. No. 10/747,016.
Non-Final Office Action Mailed May 16, 2007; U.S. Appl. No. 10/747,016.
Non-Final Office Action Mailed Jun. 23, 2006; U.S. Appl. No. 10/747,016.
Non-Final Office Action Mailed Dec. 22, 2004; Pat. No. 7012461.
Non-Final Office Action Mailed Oct. 14, 2008; U.S. Appl. No. 11/358,482.
Non-Final Office Action Mailed Dec. 26, 2007; U.S. Appl. No. 11/358,482.
Final Office Action Mailed Feb. 23, 2009; U.S. Appl. No. 11/358,482.
Non-Final Office Action Mailed Apr. 4, 2007; U.S. Appl. No. 11/358,482.

Final Office Action Mailed May 23, 2008; U.S. Appl. No. 11/358,482.
Non-Final Office Action Mailed Jul. 23, 2009; U.S. Appl. No. 11/358,482.
Final Office Action Mailed Aug. 23, 2007; U.S. Appl. No. 11/358,482.
Non-Final Office Action Mailed Feb. 3, 2009; U.S. Appl. No. 10/874,407.
Non-Final Office Action Mailed Aug. 9, 2006; U.S. Appl. No. 10/874,407.
Final Office Action Mailed Feb. 28, 2007; Pat. No. 7562233.
Non-Final Office Action Mailed Jun. 20, 2007; Pat. No. 7562233.
Non-Final Office Action Mailed Sep. 6, 2006; Pat. No. 7562233.
Oner, H. et al., "A compact monitoring circuit for real-time on-chip diagnosis of hot-carrier induced degradation", Microelectronic Test Structures, 1997. ICMTS 1997. Proceedings, IEEE International Conference on Monterey, CA, Mar. 17-20, 1997, pp. 72-76.
Restriction Requirement Mailed Mar. 19, 2007; U.S. Appl. No. 10/951,835.
Restriction Requirement Mailed May 28, 2009; U.S. Appl. No. 11/810,516.
Supplemental Notice of Allowance Mailed Dec. 13, 2007; Pat. No. 7362165.
Notice of Allowance Mailed Dec. 18, 2008; U.S. Appl. No. 10/747,016.
Notice of Allowance Mailed Aug. 27, 2008; U.S. Appl. No. 10/747,016.
Notice of Allowance Mailed Aug. 20, 2009; U.S. Appl. No. 10/747,016.
Notice of Allowance Mailed Sep. 22, 2005; Pat. No. 7228242.
Non-Final Office Action Mailed Feb. 18, 2009; U.S. Appl. No. 10/334,918.

* cited by examiner

PRECISE CONTROL COMPONENT FOR A SUBSTRATE POTENTIAL REGULATION CIRCUIT

This case is related to commonly assigned U.S. patent application "A STABILIZATION COMPONENT FOR A SUBSTRATE POTENTIAL REGULATION CIRCUIT", by T. Chen, Ser. No. 10/747,022, filed on Dec. 23, 2003, which is incorporated herein in its entirety.

This case is related to commonly assigned U.S. patent application "FEEDBACK-CONTROLLED BODY-BIAS VOLTAGE SOURCE", by T. Chen, U.S. patent application Ser. No. 10/747,016, filed on Dec. 23, 2003, which is incorporated herein in its entirety.

This case is related to commonly assigned U.S. patent application "SERVO-LOOP FOR WELL-BIAS VOLTAGE SOURCE", by Chen, et al., U.S. patent application Ser. No. 10/747,015, filed on Dec. 23, 2003, which is incorporated herein in its entirety.

TECHNICAL FIELD

Embodiments of the present invention relate to body biasing circuits for providing operational voltages in integrated circuit devices.

BACKGROUND ART

As the operating voltages for CMOS transistor circuits have decreased, variations in the threshold voltages for the transistors have become more significant. Although low operating voltages offer the potential for reduced power consumption and higher operating speeds, threshold voltage variations due to process and environmental variables often prevent optimum efficiency and performance from being achieved. Body-biasing is a prior art mechanism for compensating for threshold voltage variations. Body-biasing introduces a reverse bias potential between the bulk and the source of the transistor, allowing the threshold voltage of the transistor to be adjusted electrically. It is important that the circuits that implement and regulate the substrate body biasing function effectively and precisely. Inefficient, or otherwise substandard, body bias control can cause a number of problems with the operation of the integrated circuit, such as, for example, improper bias voltage at the junctions, excessive current flow, and the like.

DISCLOSURE OF THE INVENTION

Embodiments of the present invention provide a control component for substrate potential regulation for an integrated circuit device.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Figure 1:
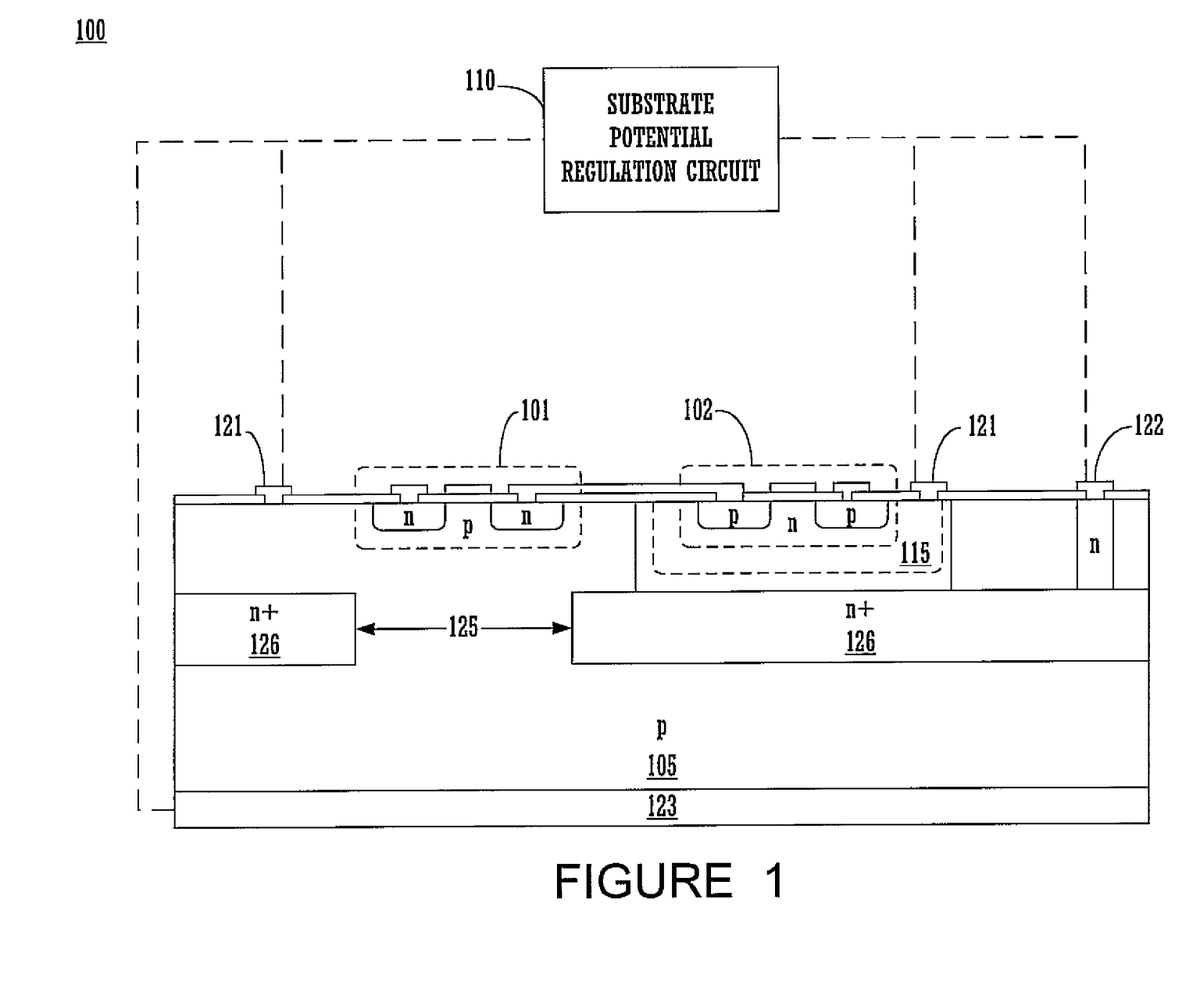
FIG. 1 shows an exemplary integrated circuit device in accordance with one embodiment of the present invention.

FIG. 1 shows an exemplary integrated circuit device 100 in accordance with one embodiment of the present invention. As depicted in FIG. 1, the integrated circuit device 100 shows an inverter having connections to a body-biasing substrate potential regulation circuit 110 (e.g., hereafter regulation circuit 110). The regulation circuit 110 is coupled to provide body bias currents to a PFET 102 through a direct bias contact 121, or by a buried n-well 126 using contact 122. As shown in FIG. 1, a p-type substrate 105 supports an NFET 101 and the PFET 102 resides within an n-well 115. Similarly, body-bias may be provided to the NFET 101 by a surface contact 121, or by a backside contact 123. An aperture 125 may be provided in the buried n-well 126 so that the bias potential reaches the NFET 101. In general, the PFET 102 or the NFET 101 may be biased by the regulation circuit 110 through one of the alternative contacts shown. The integrated circuit device 100 employs body-biasing via the regulation circuit 110 to compensate for any threshold voltage variations.

Additional description of the operation of a regulation circuit in accordance with embodiments of the present invention can be found in commonly assigned "FEEDBACK-CONTROLLED BODY-BIAS VOLTAGE SOURCE", by T. Chen, U.S. patent application Ser. No. 10/747,016, filed on Dec. 23, 2003, which is incorporated herein in its entirety.

Figure 2:
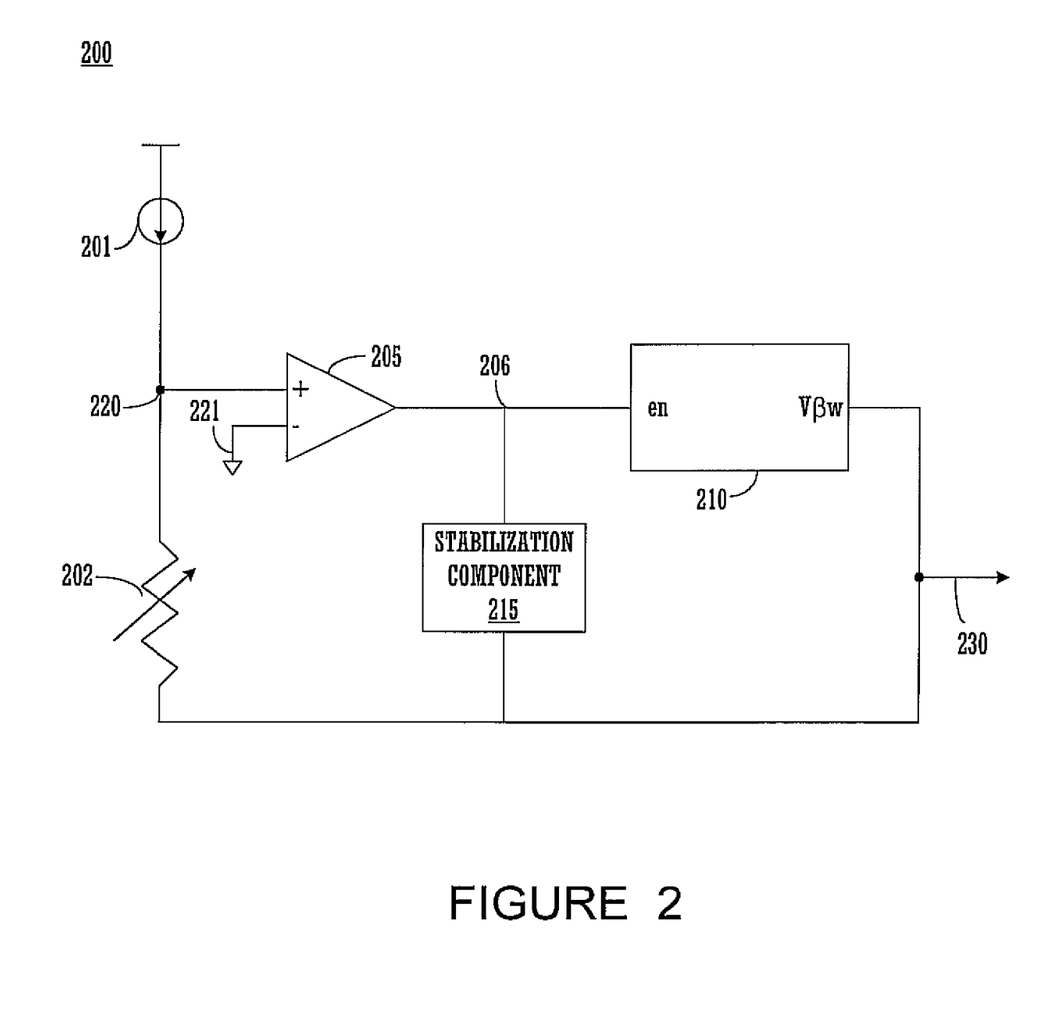
FIG. 2 shows a diagram depicting the internal components of the regulation circuit in accordance with one embodiment of the present invention.

FIG. 2 shows a diagram depicting the internal components of the regulation circuit 200 in accordance with one embodiment of the present invention. The regulation circuit 200 shows one exemplary component configuration suited for the implementation of the regulation circuit 110 shown in FIG. 1 above.

In the regulation circuit 200 embodiment, a current source 201 and a variable resistor 202 are coupled to generate a reference voltage at a node 220 (e.g., hereafter reference voltage 220) as shown. The reference voltage 220 is coupled as an input for a comparator 205. The output of the comparator 205 is coupled to a charge pump 210 and a stabilization component 215. The output of the regulation circuit 200 is generated at an output node 230. The output node 230 can be coupled to one or more body bias contacts of an integrated circuit device (e.g., the contacts 121-123 shown in FIG. 1).

In the regulation circuit 200 embodiment, the current source 201 and the variable resistor 202 form a control circuit, or control component, that determines the operating point of the regulation circuit 200. The current source 201 and the variable resistor 202 determine the reference voltage 220. The comparator 205 examines the reference voltage 220 and the ground voltage 221 and switches on if the reference voltage 220 is higher than the ground voltage 221. The comparator output 206 turns on the charge pump 210, which actively drives the output node 230 to a lower (e.g., negative) voltage. The effect of turning on the charge pump 210 is to actively drive the body bias of a coupled integrated circuit to a lower voltage. This lower voltage will eventually be seen at the reference voltage node 220 of the comparator 205. Once the reference voltage 220 and the ground voltage 221 are equalized, the comparator will switch off, thereby turning off the charge pump 210. With the constant reference current from the current source 201, the body bias of the integrated circuit device will thus be equal to the voltage drop across the variable resistor 202.

Once the charge pump 210 is turned off, the body bias of the integrated circuit device will rise over time as the numerous components of the integrated circuit device sink current to ground. When the reference voltage 220 rises above the ground voltage 221, the comparator 205 will switch on the charge pump 210 to re-establish the desired body bias. A typical value for Vdd for the integrated circuit device is 2.5 volts.

As described above, the current source 201 and the variable resistor 202 determine the reference voltage 220, and thus, the operating point of the regulation circuit 200. The reference voltage 220 is generated by a reference current flowing from the current source 201 through the variable resistor 202. Accordingly, the reference voltage 220 is adjusted by either adjusting the reference current or adjusting the resistance value of the variable resistor 202.

In one embodiment, the reference current is designed for stability and is controlled by a band gap voltage source of the integrated circuit device. Thus, as the temperature of the device changes, the reference current should be stable. Additionally, the reference current should be stable across normal process variation. A typical value for the reference current is 10 microamps. In such an embodiment, the reference voltage 220 is adjusted by changing the variable resistance 202.

In the present embodiment, the stabilization component 215 functions as a stabilizing shunt that prevents over charging of the body bias. As described above, once the charge pump 210 is turned off, the body bias of the integrated circuit device will rise over time as the integrated circuit device sinks current to ground. The stabilization component 215 functions in those cases when the charge pump 210 overcharges the body bias.

Figure 3:
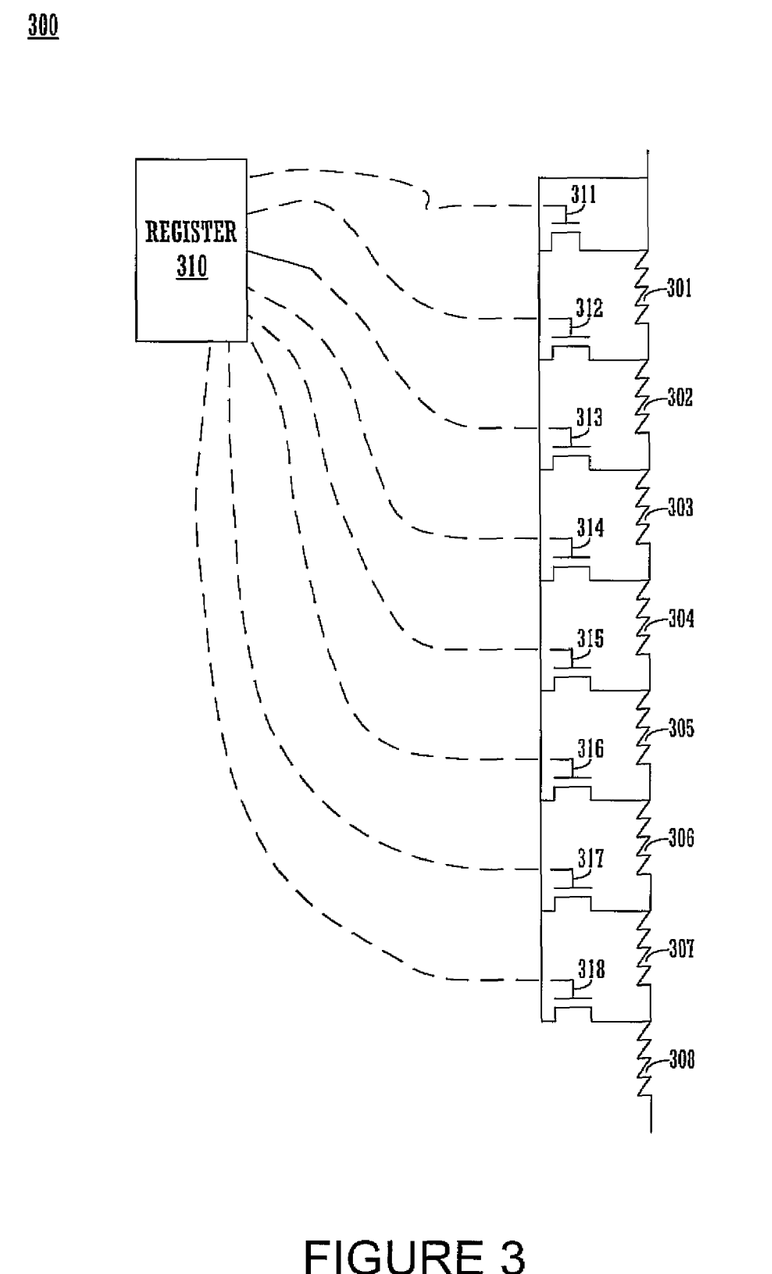
FIG. 3 shows a diagram of a resistor chain in accordance with one embodiment of the present invention.

FIG. 3 shows a diagram of a resistor chain 300 in accordance with one embodiment of the present invention. The resistor chain 300 shows one configuration suited for the implementation of the variable resistor 202 shown in FIG. 2 above. The resistor chain 300 comprises a chain of resistor elements 301-308 arranged in series. In the present embodiment, a resistance value for the resistor chain 300 is selected by tapping a selected one of the resistor elements 301-308. This is accomplished by turning on one of the coupled transistors 311-318. For example, increasing the resistance value is accomplished by tapping a resister earlier in the chain (e.g., resistor 301) 300 as opposed to later in the chain (e.g., resistor 307). The resistance value is selected by writing to a configuration register 310 coupled to control the transistors 311-318.

Figure 4:
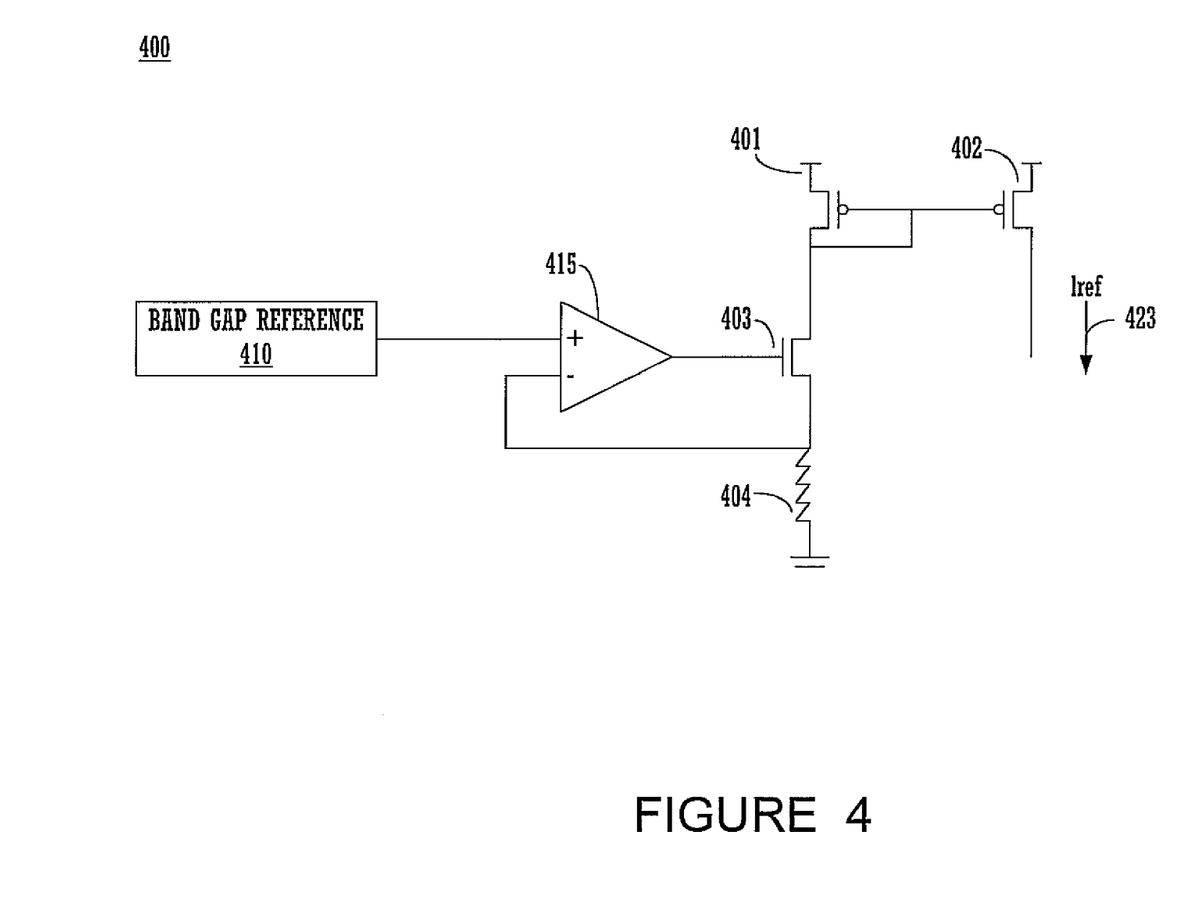
FIG. 4 shows a diagram of a current source in accordance with one embodiment of the present invention.

FIG. 4 shows a diagram of a current source 400 in accordance with one embodiment of the present invention. The current source 400 shows one configuration suited for the implementation of the current source 201 shown in FIG. 2. The current source 400 includes a band gap voltage reference 410 coupled to an amplifier 415. The amplifier 415 controls the transistor 403, which in turn controls the current flowing through the transistor 401 and the resistor 404. This current is mirrored by the transistor 402, and is the reference current generated by the current source 400 (e.g., depicted as the reference current 420).

In this embodiment, the use of a band gap voltage reference 410 results in a stable reference current 420 across different operating temperatures and across different process corners. The reference voltage 220 is governed by the expression K*Vbg, where K is the ratio of the variable resistor 202 and the resistance within the band gap reference 410 and Vbg is the band gap voltage.

Figure 5:
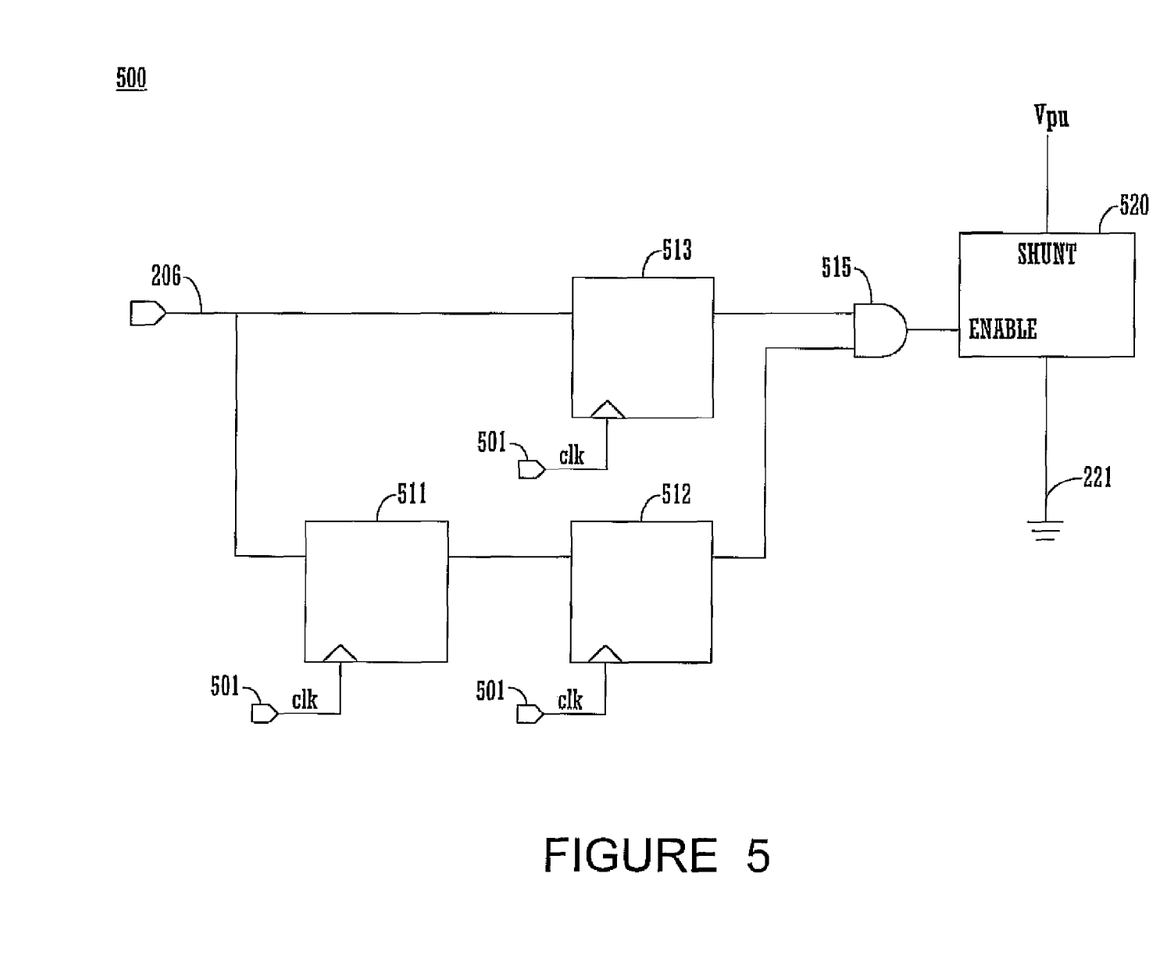
FIG. 5 shows a diagram of a stabilization component in accordance with one embodiment of the present invention.

FIG. 5 shows a diagram of a stabilization component 500 in accordance with one embodiment of the present invention. The stabilization component 500 shows one configuration suited for the implementation of the stabilization component 215 shown in FIG. 2. In the present embodiment, the stabilization component 500 functions as a stabilizing shunt that prevents over charging of the body bias.

As described above, once the charge pump 210 is turned off, the body bias of the integrated circuit device, and thus the ground voltage 221, will rise over time as the integrated circuit device sinks current to ground. The stabilization component 215 functions in those cases when the charge pump 210 overcharges the body bias. For example, there may be circumstances where the charge pump 210 remains on for an excessive amount of time. This can cause an excessive negative charge in the body of the integrated circuit device. The stabilization component 215 can detect an excessive charging action of the charge pump 210.

When excessive charging is detected (e.g., the charge pump 210 being on too long), the stabilization component 215 can shunt current directly between ground and the body bias (e.g., Vpw), thereby more rapidly returning the body bias voltage to its desired level. When the reference voltage 220 rises to the ground voltage 221, the comparator 205 will switch on the charge pump 210 to maintain the desired body bias.

In the stabilization component 500 embodiment, the output of the comparator 205 is coupled as an input to three flip-flops 511-513. The flip-flops 511-513 receive a common clock signal 501. The flip-flops 511 and 512 are coupled in series as shown. The outputs of the flip-flops 512 and 513 are inputs to the AND gate 515. The AND gate 515 controls the enable input of a shunt switch 520.

In normal operation, the comparator output 206 will cycle between logic one and logic zero as the comparator 205 turns off and turns off the charge pump 210 to maintain the voltage reference 220 in equilibrium with ground 221. Thus, the output 206 will oscillate at some mean frequency (e.g., typically 40 MHz). The clock signal 501 is typically chosen to match this frequency. If the comparator output 206 remains high for two consecutive clock cycles, the shunt switch 520 will be enabled, and current will be shunted between, in a negative charge pump case, between Vpw and ground, as depicted. In a positive charge pump case (e.g., FIG. 6) current will be shunted between Vnw and Vdd.

Figure 6:
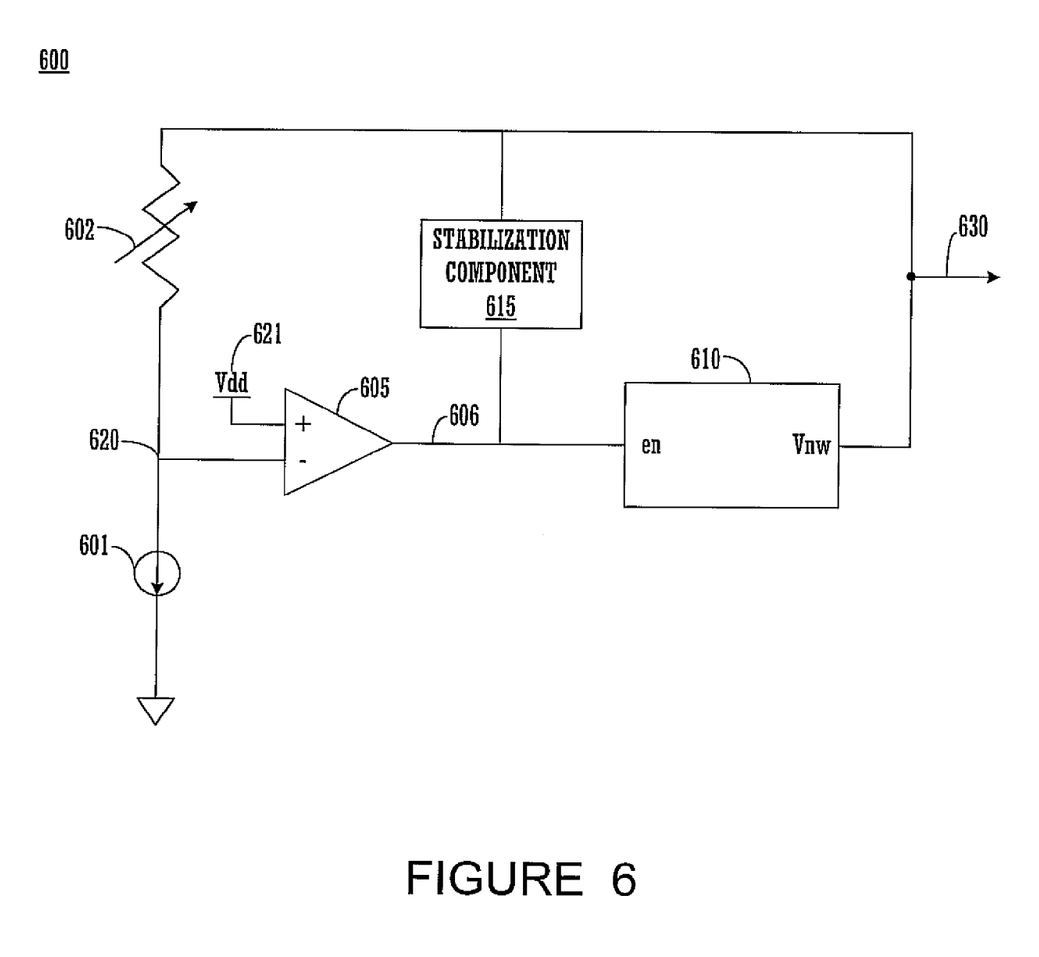
FIG. 6 shows a diagram of a positive charge pump regulation circuit in accordance with one embodiment of the present invention.

FIG. 6 shows a diagram of a positive charge pump regulation circuit 600 in accordance with one embodiment of the present invention. The regulation circuit 600 shows one exemplary component configuration suited for the implementation of a positive charge pump (e.g., Vnw) version of the regulation circuit 110 above.

The regulation circuit 600 embodiment functions in substantially the same manner as the circuit 200 embodiment. A current source 601 and a variable resistor 602 are coupled to generate a reference voltage at a node 620 as shown. The reference voltage 620 is coupled as an input for a comparator 605. The output of the comparator 605 is controls a charge pump 610 and a stabilization component 615. The output of the regulation circuit 600 is generated at an output node 630 and is for coupling to the Vnw body bias contacts of an integrated circuit device.

As with the circuit 200 embodiment, the current source 601 and the variable resistor 602 form a control circuit that determines the operating point. The comparator 605 and the charge pump 610 actively drive the output node 630 to force the reference voltage 620 and Vdd 621 into equilibrium. With the constant reference current from the current source 601, the Vnw body bias of the integrated circuit device will thus be equal to the voltage drop across the variable resistor 602.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A control component comprising:
   a comparator configured to regulate a body bias voltage of an integrated circuit device, wherein the comparator includes a first input, a second input, and an output node;
   a stabilization component coupled to the output node, wherein the stabilization component is configured to respond to excessive charging of the body bias voltage, wherein the stabilization component includes a plurality of flip-flops, an AND gate coupled to the flip-flops, and a shunt switch coupled to the AND gate and configured to discharge the body bias voltage in response to an output signal at the output node and in response to excessive charging of the body bias voltage;
   a current source coupled to the first input, wherein the current source is configured to generate a reference current; and
   a variable resistor coupled to the current source and to the first input,
   wherein the reference current is configured to flow through the variable resistor to generate a reference voltage at the first input, and
   wherein the comparator is further configured to use the reference voltage and the second input to generate the output signal at the output node.

2. The control component of claim 1, wherein the body bias voltage is configured to be maintained by adjusting the reference voltage at the first input.

3. The control component of claim 1, wherein the current source includes a current mirror circuit, wherein the current mirror circuit is configured to generate the reference current in accordance with a current source reference voltage.

4. The control component of claim 3, wherein the current source reference voltage is a band gap reference voltage generated by a band gap reference circuit.

5. The control component of claim 1, wherein the variable resistor comprises a chain of resistor elements, and wherein a resistance value for the variable resistor is configured to be selected by tapping a selected one of the resistor elements in the chain.

6. The control component of claim 5 further comprising a register coupled to the chain of resistor elements and configured to select the resistance value of the chain.

7. The control component of claim 1, wherein the current source is further configured to adjust the reference voltage at the first input by altering the reference current flowing to the variable resistor.

8. The control component of claim 1, wherein the variable resistor is further configured to adjust the reference voltage at the first input by altering a resistance value of the variable resistor.

9. The control component of claim 1, wherein the body bias voltage is configured to body bias a P-type substrate of the integrated circuit device.

10. The control component of claim 1, wherein the body bias voltage is configured to body bias an N-type substrate of the integrated circuit device.

11. A control circuit comprising:
    means for regulating a body bias voltage of an integrated circuit device, wherein the means for regulating includes a first input, a second input, and an output node;
    means for stabilizing the body bias voltage coupled to the output node, wherein the means for stabilizing is configured to respond to excessive charging of the body bias voltage, wherein the means for stabilizing includes a plurality of flip-flops, an AND gate coupled to the flip-flops, and a shunt switch coupled to the AND gate and configured to discharge the body bias voltage in response to an output signal at the output node and in response to excessive charging of the body bias voltage;
    means for generating a reference current coupled to the first input; and
    means for generating a reference voltage at the first input coupled to the means for generating the reference current and coupled to the first input,
    wherein the means for generating the reference voltage is configured to receive the reference current, and
    wherein means for regulating is configured to use the reference voltage and the second input to generate the output signal at the output node.

12. The control circuit of claim 11, wherein the means for generating the reference current is configured to adjust the reference voltage at the first input by altering the reference current flowing to the means for generating the reference voltage.

13. The control circuit of claim 11, wherein the means for generating the reference voltage is configured to adjust the reference voltage at the first input by altering a resistance value of the means for generating the reference voltage.

14. The control circuit of claim 11, wherein the means for generating the reference current includes a current mirror circuit, and wherein the current mirror circuit is configured to generate the reference current in accordance with a band gap reference voltage generated by a band gap reference circuit.

15. The control circuit of claim 11, wherein the means for generating the reference voltage comprises a chain of resistor elements, and wherein a resistance value for the chain of resistor elements is configured to be selected by tapping a selected one of the resistor elements in the chain, and further comprising a register coupled to the chain of resistor elements and configured to select the resistance value of the chain.

16. A control circuit comprising:

a comparator configured to regulate a body bias voltage of an integrated circuit device, wherein the comparator includes a first input, a second input, and an output node;

a stabilization component coupled to the output node, wherein the stabilization component includes a plurality of flip-flops, an AND gate coupled to the flip-flops, and a shunt switch coupled to the AND gate and configured to discharge the body bias voltage in response to an output signal at the output node, and wherein the flip-flops are configured to receive the output signal and a clock signal;

a current source coupled to the first input, wherein the current source is configured to generate a reference current; and a variable resistor coupled to the current source and to the first input, wherein the reference current is configured to flow through the variable resistor to generate a reference voltage at the first input, and wherein the comparator is further configured to use the reference voltage and the second input to generate the output signal at the output node.

17. The control circuit of claim 16, wherein the current source includes a current mirror circuit, wherein the current mirror circuit is configured to generate the reference current in accordance with a band gap reference voltage generated by a band gap reference circuit.

18. The control circuit of claim 17, wherein the variable resistor comprises a chain of resistor elements, and wherein a resistance value for the variable resistor is configured to be selected by tapping a selected one of the resistor elements in the chain to adjust the reference voltage at the first input.

19. The control circuit of claim 18 further comprising a register coupled to the chain of resistor elements and configured to select the resistance value of the chain.

* * * * *